United States Patent
Kitamura et al.

(10) Patent No.: US 7,633,986 B2
(45) Date of Patent: Dec. 15, 2009

(54) DISTRIBUTED FEEDBACK LASER DIODE

(75) Inventors: Shotaro Kitamura, Kanagawa (JP); Yasutaka Sakata, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 84 days.

(21) Appl. No.: 11/754,861

(22) Filed: May 29, 2007

(65) Prior Publication Data

US 2007/0280321 A1 Dec. 6, 2007

(30) Foreign Application Priority Data

May 30, 2006 (JP) .................. 2006-149905

(51) Int. Cl.
*H01S 5/00* (2006.01)

(52) U.S. Cl. .................. 372/50.11; 372/96

(58) Field of Classification Search ............. 372/102, 372/49.01, 45.012, 50.123, 43.01
See application file for complete search history.

(56) References Cited

U.S. PATENT DOCUMENTS

| | | | |
|---|---|---|---|
| 4,794,618 A * | 12/1988 | Mito | 372/96 |
| 4,796,273 A * | 1/1989 | Yamaguchi | 372/96 |
| 5,212,712 A * | 5/1993 | Makuta | 372/96 |
| 5,386,433 A * | 1/1995 | Ohkura et al. | 372/96 |
| 6,018,541 A * | 1/2000 | Huang | 372/50.11 |
| 6,111,906 A * | 8/2000 | Muroya | 372/96 |
| 6,330,268 B1 * | 12/2001 | Huang | 372/96 |
| 6,574,261 B2 * | 6/2003 | Huang | 372/96 |
| 6,825,505 B2 * | 11/2004 | Huang | 257/191 |
| 7,277,465 B2 * | 10/2007 | Aoyagi et al. | 372/96 |
| 2002/0037024 A1 * | 3/2002 | Huang | 372/50 |

FOREIGN PATENT DOCUMENTS

| | | |
|---|---|---|
| JP | 63-32988 A | 2/1988 |
| JP | 2003-152272 A | 5/2003 |
| JP | 2003-204114 A | 7/2003 |

OTHER PUBLICATIONS

"Laser Kogaku Nyumon" Introduction to Laser Engineering, supervised by Fumio Inaba, edited by IEICE, The Institute of Electronics, Information and Communication Engineers, 1997, pp. 172-176.

* cited by examiner

*Primary Examiner*—Minsun Harvey
*Assistant Examiner*—Tuan N. Nguyen
(74) *Attorney, Agent, or Firm*—Sughrue Mion, PLLC

(57) ABSTRACT

A distributed feedback laser diode comprises a phase-shifting portion in diffraction gratings. The magnitude of a phase shift in the phase-shifting portion is $8\Lambda/40$ to $9\Lambda/40$, $\Lambda$ representing twice the distance between the diffraction gratings. A main mode stands on a lower wavelength side than the center of a stop band when an injected current is of a level of a threshold current, whereas the main mode is shifted to the center of the stop band and a sub mode is suppressed from growing when the injected current is of a level of an operating current.

2 Claims, 10 Drawing Sheets

PHASE SHIFT = (11/40)Λ

PHASE SHIFT = (10/40)Λ

PHASE SHIFT = (9/40)Λ

PHASE SHIFT = (8/40)Λ

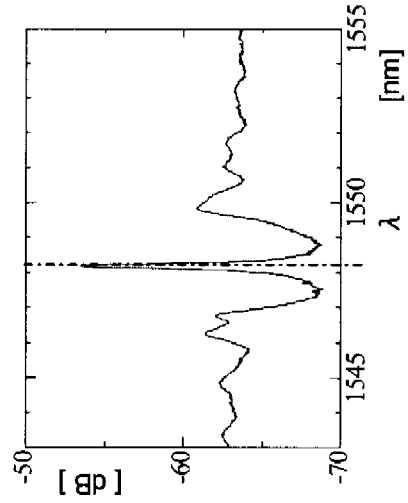
FIG. 5A PHASE SHIFT = (11/40)Λ
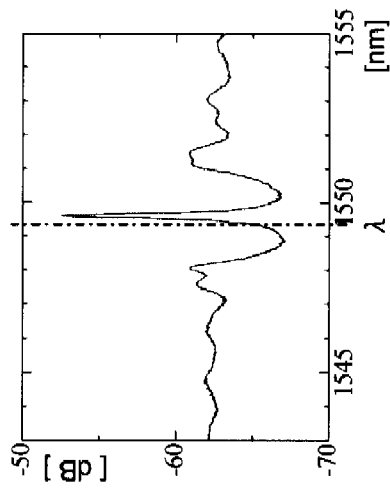
FIG. 5B PHASE SHIFT = (10/40)Λ
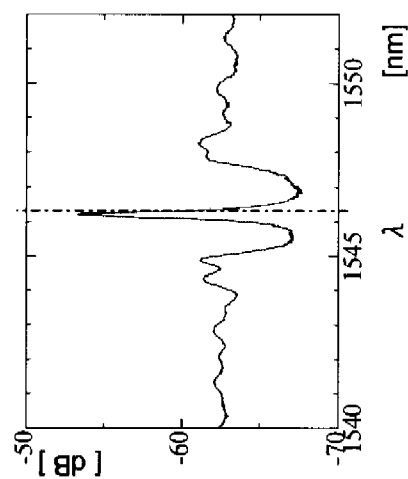
FIG. 5C PHASE SHIFT = (9/40)Λ
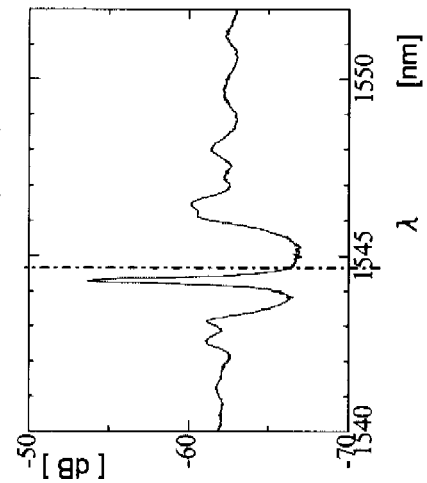
FIG. 5D PHASE SHIFT = (8/40)Λ

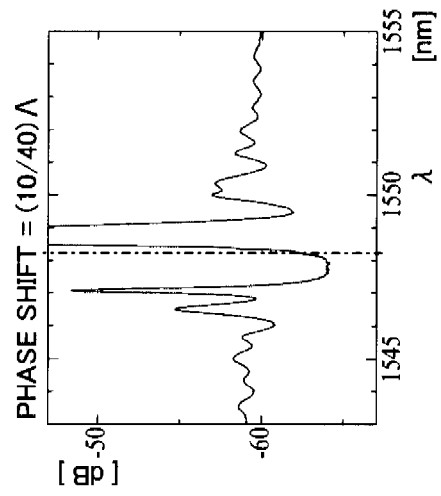
FIG. 6A PHASE SHIFT = (11/40)Λ
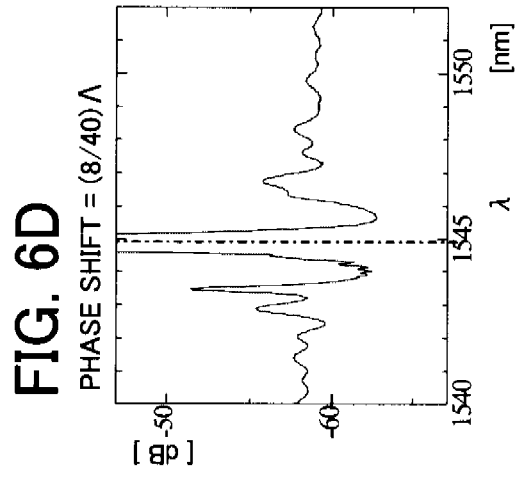
FIG. 6B PHASE SHIFT = (10/40)Λ
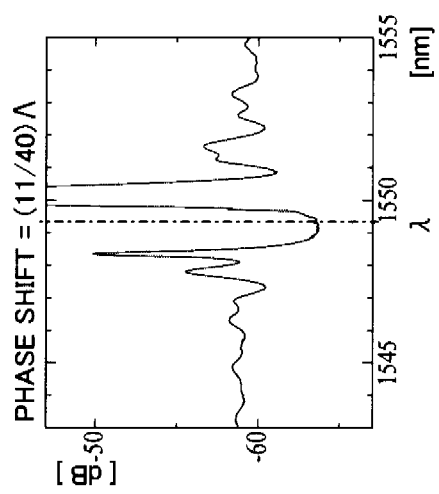
FIG. 6C PHASE SHIFT = (9/40)Λ
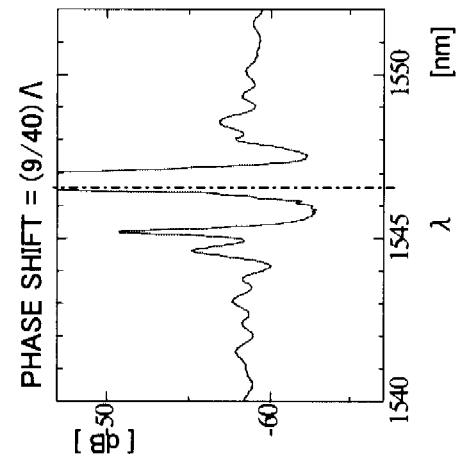
FIG. 6D PHASE SHIFT = (8/40)Λ

0.95$I_{TH}$ IS INJECTED

DECREASE OF PEAK DIFFERENCE BETWEEN MAIN MODE AND SUB MODE RESULTS IN TWO-MODE OSCILLATION.

0.9$I_{TH}$ IS INJECTED

REFERENCE CASE

REFERENCE CASE

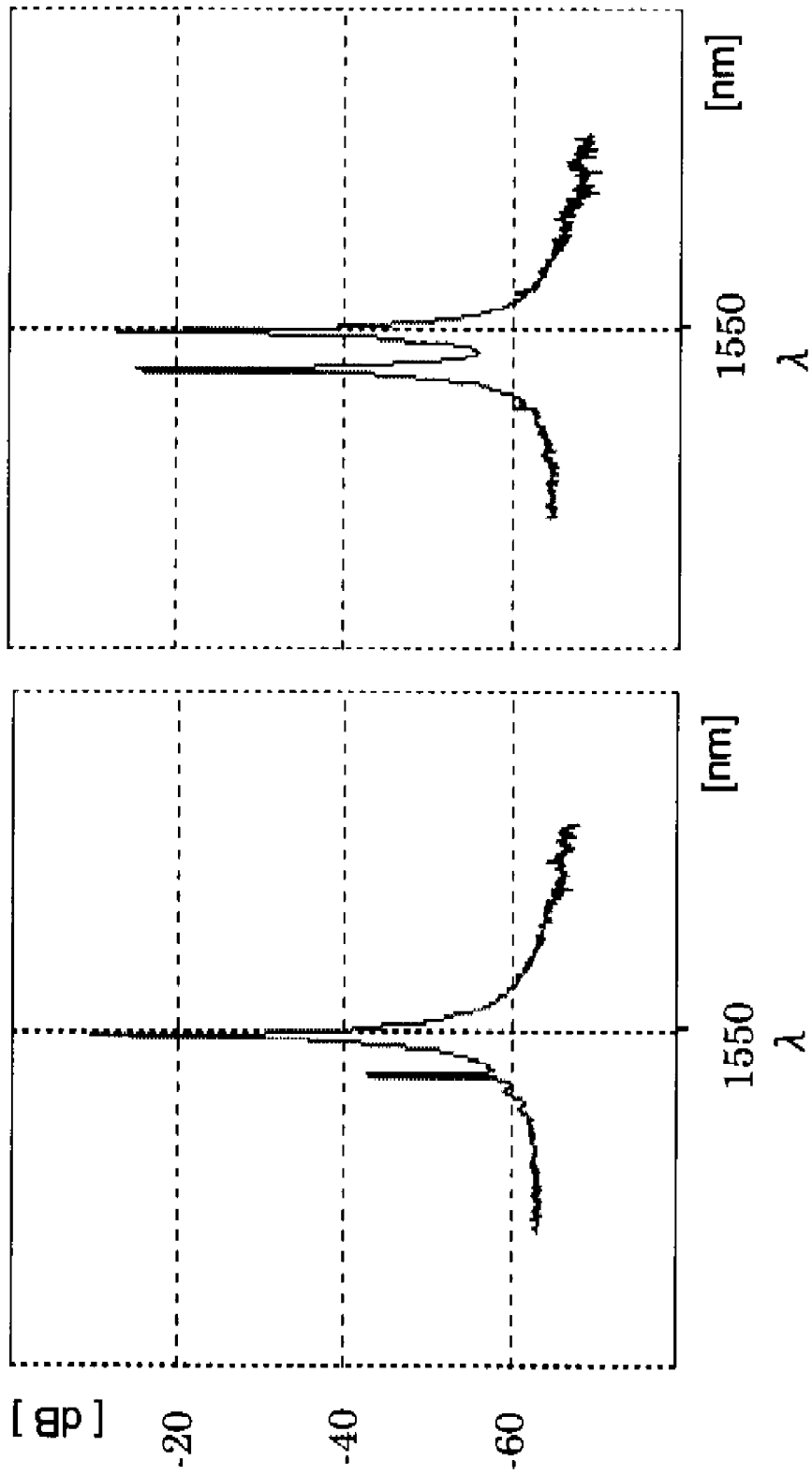
FIG. 10 REFERENCE CASE

DISTRIBUTED FEEDBACK LASER DIODE

REFERENCE TO RELATED APPLICATIONS

The present application is claiming the priority of the earlier Japanese patent application No. 2006-149905 filed on May 30, 2006, the entire disclosure thereof being incorporated herein by reference thereto.

FIELD OF THE INVENTION

This invention relates to a distributed feedback laser diode.

BACKGROUND OF THE INVENTION

In an optical communication technology, a distributed feedback laser diode (DFB-LD) is used as a laser diode which oscillates in a single longitudinal mode. The DFB-LD is used for an optical signal transmission at a modulation rate 1.0 G bps or more and a distance of 20 km or more and, especially, the optical signal transmission at a modulation rate 2.5 G bps or more and a distance of 50 km or more.

In order to achieve the single mode oscillation, the DFB-LD generally has a phase-shifter which shifts the phase by $\Lambda/4$ in diffraction gratings (see Non-Patent Document 1, for example). Note that the present invention, the magnitude of the phase shift is not shown by "$\lambda$" representing the oscillating optical wavelength, but by "$\Lambda$" representing twice the distance between the diffraction gratings.

The DFB-LDs in which the magnitude of the phase shift is adjusted are disclosed in, for example, Patent Documents 1-3. Patent Document 1 discloses a DFB-LD in which diffraction gratings having the magnitude of a phase shift of $\Lambda/16$ to $3\Lambda/8$ for operating at a stable single axial mode. Patent Document 2 discloses a DFB-LD which has a magnitude of a phase shift of $\Lambda/2$ to $\Lambda/n$ where n=4 to 16, for suppressing wavelength chirping upon modulation. Patent Document 3 discloses a DFB-LD which has two phase-shifting portions each having the magnitude of a phase shift of, for example, $\Lambda/8$ for improving emission efficiency in a stable single mode.

[Patent Document 1]
  JP Patent Kokai Publication No. JP-A-63-32988

[Patent Document 2]
  JP Patent Kokai Publication No. JP-P2003-204114A

[Patent Document 3]
  JP Patent Kokai Publication No. JP-P2003-152272A

[Non-Patent Document 1]
  "LASER KOGAKU NYUMON" (Introduction to Laser Engineering), supervised by Fumio Inaba, edited by IEICE (The Institute of Electronics, Information and Communication Engineers), 1997, pp. 172-176

SUMMARY OF THE DISCLOSURE

The following analysis is given by the present invention. The entire disclosures of the above mentioned Patent Documents and Non-Patent Document are herein incorporated by reference thereto.

A DFB-LD has two wavelengths, a main mode and a sub mode, capable of laser oscillation. Only one wavelength thereof is selectively oscillated by a phase shift in the diffraction gratings. For the DFB-LD used in a high frequency band communication of 2.5 G bps or more, a ratio of the main mode to the sub mode (SMSR; Side Mode Suppression Ratio) of 30 dB or more is required in order to avoid a failure in the transmission caused by group delay of different wavelengths In the DFB-LD in which the diffraction gratings have a phase-shifter having the magnitude of the phase shift of $\Lambda/4$, however, an increase of an injected electric current causes a shift of the main mode, which is an oscillation mode, to the long wavelength side in a stop band and sometimes causes a stop band end peak to rise into a high peak on the short wavelength side as shown in, for example, FIG. 9B. In this state, the single mode oscillation of the main mode can not be formed as shown in FIG. 10.

According to the inventors' view, the reason that the single mode oscillation can not be achieved by the increase of the electric current in the $\Lambda/4$ shift DFB-LD is considered as follows. When laser oscillation is operated, the optical density of a waveguide in the phase-shifting portion increases locally, and the amount of carrier consumption becomes greater as compared with the other part of the waveguide. This makes the carrier density in the phase-shifting portion lower locally (spatial hole burning), and the refractive index of the waveguide in the phase-shifting portion increases relatively. Therefore, the length of an optical path in the phase-shifting portion becomes substantially greater than desired $\Lambda/4$ as set. In the present invention, the magnitude of the phase shift is therefore determined by taking account of the amount of the increase of the refractive index of the waveguide in advance. As shown in FIG. 1A, when an injected electric current If is at a level of a threshold electric current ($0.9\,I_{th}$), it is so designed that a main mode is to be located on a shorter wavelength side of the center of the stop band, whereas when the injected electric current If is at an operating electric current level (30 mA, for example), it is so designed that the main mode to be located at the center of the stop band.

According to a first aspect of the present invention, there is provided a distributed feedback laser diode comprising a phase-shifter in diffraction gratings, in which the magnitude of a phase shift in the phase-shifting portion is 8 $\Lambda/40$ to 9 $\Lambda/40$ ("$\Lambda$" is twice the distance between the diffraction gratings). Preferably, the distributed feedback laser diode further comprises anti-reflecting films on both end faces, i.e., forming a DFB laser diode Some documents customarily term "$\Lambda/2$—(the magnitude of a phase shift in the present invention)" as the "magnitude of phase shift". This "magnitude of phase shift" means a magnitude of an optical wave phase shift generated in an oscillated laser. This is often expressed in terms of "$\lambda$" in place of "$\Lambda$". In Patent Document 2, for example, this terminology is used. If this terminology is applied to the present invention, "$8\Lambda/40$ to $9\Lambda/40$ of the magnitude of a phase shift" corresponds to about $11\lambda/40$ to $12\lambda/40$. "$\lambda$" means a wavelength in a device. That is to say, this is shown by $\lambda=\lambda0/n$ ($\lambda0$: a wavelength in vacuum, n: a refractive index of a waveguide of device).

The meritorious effects of the present invention are summarized as follows.

When the driving electric current is large (when a laser is oscillated ordinarily, for example), a peak of the main mode can be shifted to the center of the stop band, and the suppression ratio of the sub mode to the main mode can be made greater. This can achieve a DFB-LD that oscillates in the single mode. The DFB-LD in the present invention can be used in a high-frequency band communication of, for example, 2.5 G bps or more.

BRIEF DESCRIPTION OF THE DRAWINGS

FIGS. 5A to 5D show spectra at a coupling constant κL of 3.5 and at an injected electric current of 0.9 Ith in example 1.

FIGS. 6A to 6D show spectra at a coupling constant κL of 3.5 and at an injected electric current of 30 mA in example 1.

FIG. 10 shows examples of spectra which show failure in a single oscillation of a main mode in a DFB-LD having the magnitude of a phase shift of Λ/4.

PREFERRED MODES OF THE INVENTION

Figure 1B:
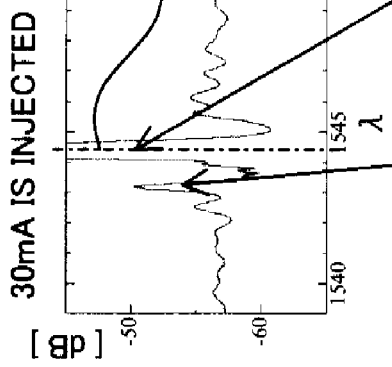
FIGS. 1A and 1B show spectra to explain an operation in an example of a DFB-LD according to the present invention.
Figure 1A:
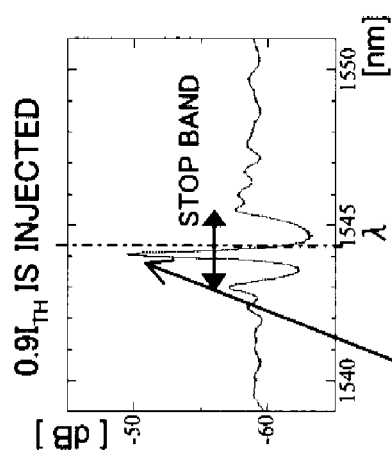
Figure 2:
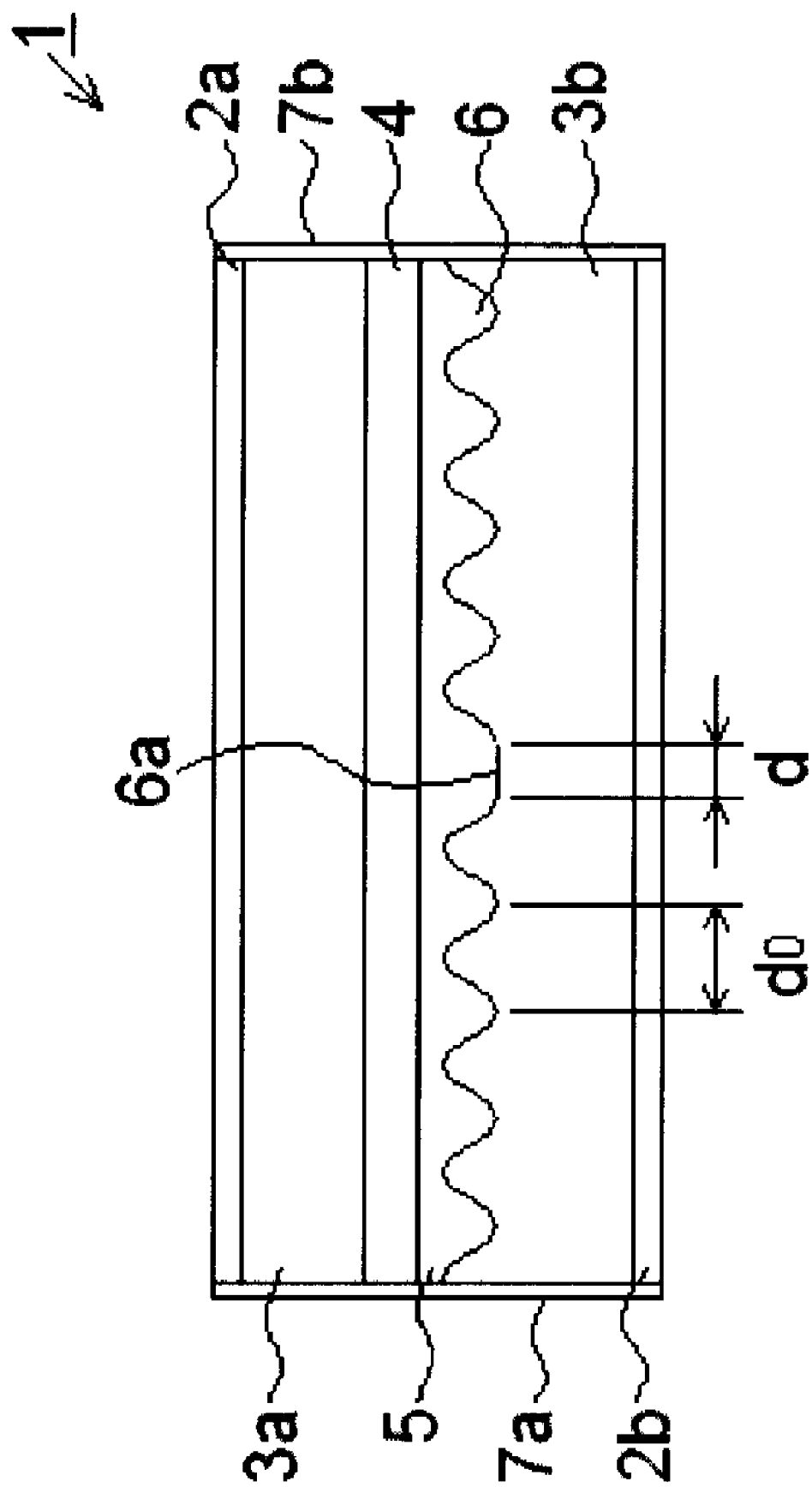
FIG. 2 is a schematic plan view for illustrating a structure of an example of a DFB-LD.
Figure 3A:
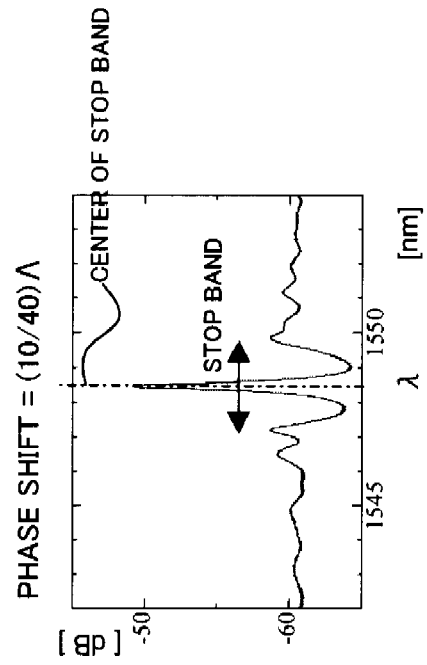
FIGS. 3A to 3D show spectra at a coupling constant κL of 2.5 and at an injected electric current of 0.9 Ith in example 1.
Figure 3B:
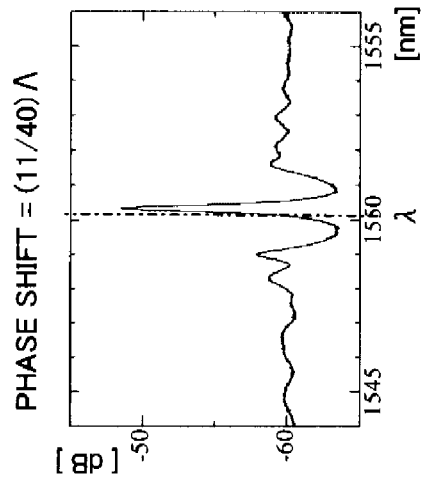
Figure 3C:
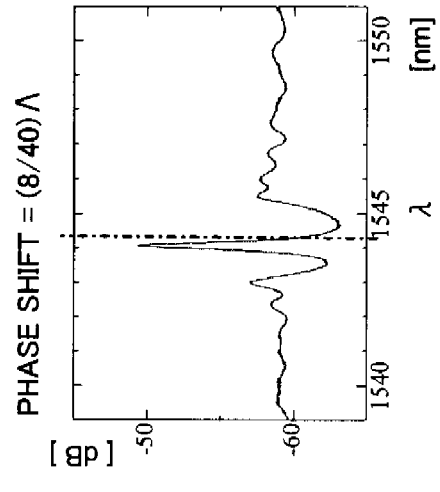
Figure 3D:
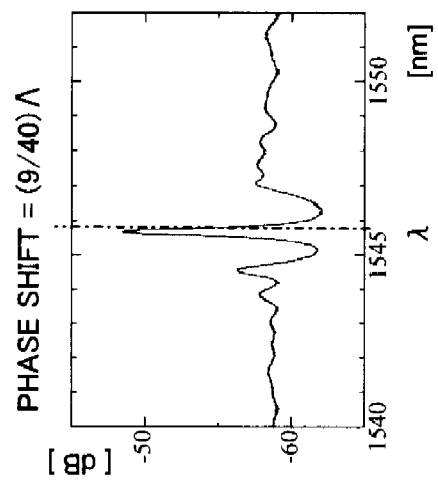
Figure 4A:
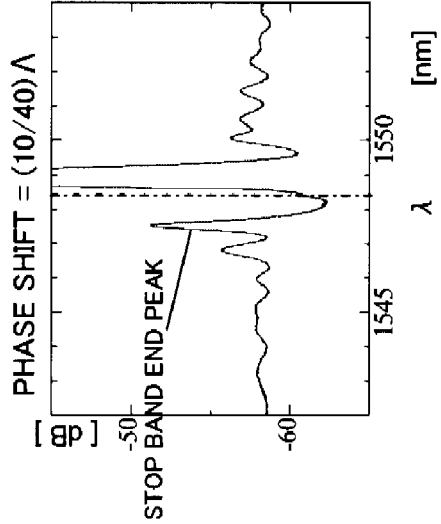
FIGS. 4A to 4D show spectra at a coupling constant κL of 2.5 and at an injected electric current of 30 mA in example 1.
Figure 4B:
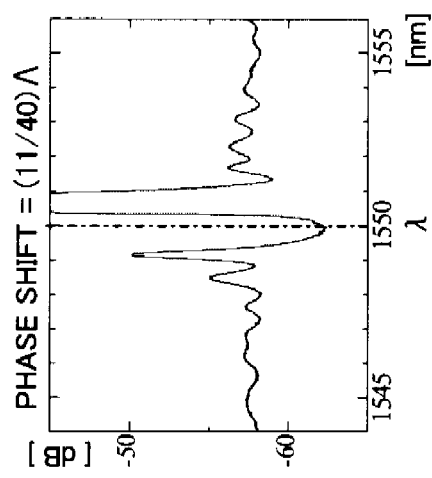
Figure 4C:
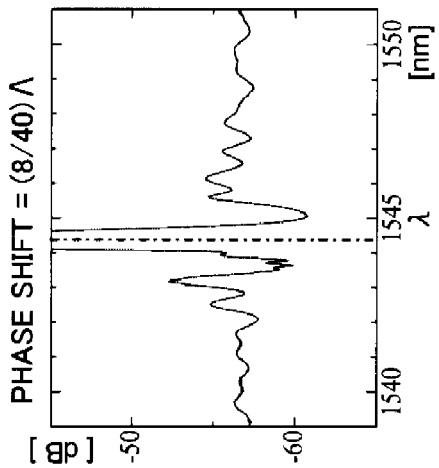
Figure 4D:
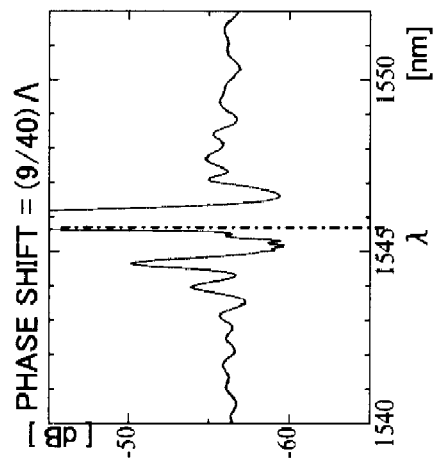

A DFB-LD according to an example of the present invention will be explained. FIG. 2 is a schematic plan view showing a structure of the DFB-LD. The DFB-LD 1 comprises an active layer 4 of a multi-quantum well (MQW) type, diffraction gratings 6 under the active layer 4 and anti-reflecting films (anti-reflecting coats) 7a, 7b on both end faces. The diffraction gratings have a phase-shifting portion (termed "phase-shifter") 6a. The magnitude d of a phase shift in the phase-shifter 6a in the present invention is 8Λ/40 to 9Λ/40. "Λ" is twice the distance $d_0$ between the peaks or bottoms of the diffraction gratings 6 (the cycle of the diffraction gratings). In the present invention, a main mode is oscillated at the center of the stop band by making the magnitude of the phase shift smaller than Λ/4 beforehand. If the magnitude of the phase shift is greater than 9Λ/40, when an electric current for an ordinary operation is injected, the main mode is shifted to a longer wavelength side of the center of the stop band, and a single mode oscillation could not be achieved because of growth of a peak on a short wavelength side. On the other hand, if the magnitude of the phase shift is smaller than 8Λ/40, when an electric current for an ordinary operation is injected, the main mode is shifted to the shorter wavelength side of the center of the stop band.

The effect of the present invention does not depend on the position of the phase-shifter 6a although the phase-shifter 6a is formed at the axial center in the DFB-LD 1 shown in FIG. 2. The phase-shifter 6a can be formed at other positions than the center of the device, for example, to change a ratio of an output of the front to that of the back. Although, the larger the distance between the phase-shifter 6a and the center of the device, the more easily a stop band end peak grows, according to the present invention, the growth of the stop band end peak can be suppressed by making the magnitude of the phase shift smaller than Λ/4.

The diffraction gratings 6 and phase-shifter 6a can be formed by electron beam (EB) patterning (for lithography) minutely.

Example 1

In order to confirm the effect of the present invention, DFB-LDs whose magnitude of phase shifts and coupling constants are different from one another were manufactured, and spectra of a threshold current level and of an ordinary operation level in each DFB-LD were observed. The prepared DFB-LDs of a 1.55 μm band had a structure like shown in FIG. 2 and comprised a MQW active layer and anti-reflecting films on both end faces. The device had a length L of 450 μm, the phase-shifting portion was formed at a position which is 195 μm distant from the front (255 μm distant from the back). The phase-shifting portion is slightly shifted to the front side from the center of the device to increase a ratio of the front output to the back output. The magnitude of the phase shift was determined to 11Λ/40, 10Λ/40 (=Λ/4), 9Λ/40 and 8Λ/40, which are a pitch of electron beam lithography, in the diffraction gratings having coupling constants κL of 2.5 and 3.5, respectively, which are indices of grating depth.

An electric current of 0.9 times as large as the threshold current (0.9 $I_{th}$) (about 10 mA) as an electric current of the threshold current level and an electric current of 30 mA to oscillate a laser (Optical power Po=about 5 mW) as the electric current of the operation level were supplied to each DFB-LD. Observed spectra are shown in FIGS. 3A to 6D. FIGS. 3A to 3D show the spectra from the DFB-LD of the coupling constant κL of 2.5 to which the electric current of 0.9 $I_{th}$ is supplied, and FIGS. 4A to 4D show the spectra from the DFB-LD of the coupling constant κL of 2.5 to which the electric current of 30 mA is supplied. FIGS. 5A to 5D show the spectra from the DFB-LD of the coupling constant κL of 3.5 to which the electric current of 0.9 $I_{th}$ is supplied, and FIGS. 6A to 6D show the spectra from the DFB-LD of the coupling constant κL of 3.5 to which the electric current of 30 mA is supplied. The magnitude of the phase shift in FIGS. 3A, 4A, 5A and 6A is 11Λ/40 upon setting by the electron beam patterning, the magnitude in FIGS. 3B, 4B, 5B and 6B is 10Λ/40, the magnitude in FIGS. 3C, 4C, 5C and 6C is 9Λ/40, and the magnitude in FIGS. 3D, 4D, 5D and 6D is 8Λ/40.

In both the DFB-LDs of the coupling constants κL of both 2.5 and 3.5, when the electric current is of (about) the threshold electric current level and the magnitude of the phase shift is at 10Λ/40 (FIG. 3B and FIG. 5B), the main mode stands at the center of the stop band. When the magnitude of the phase shift is at 11Λ/40 (FIG. 3A and FIG. 5A), the main mode stands on a slightly longer wavelength side than the center. When the magnitude of the phase shift is at 9Λ/40 and 8Λ/40 (FIGS. 3C, 3D and FIGS. 5C, 5D), the main mode stands on a slightly shorter wavelength side than the center. On the other hand, when the current is at 30 mA, the main modes in all the DFB-LDs are shifted to the long wavelength side. In, for example, the DFB-LD which has the magnitude of the phase shift of 10Λ/40 shown in FIGS. 4B and 6B, the main mode is shifted to the longer wavelength side than the center of the stop band, and a peak on the short wavelength side grows. This phenomenon is remarkable in the DFB-LD having κL of 3.5 especially. In the DFB-LD having the anti-reflecting films on both end faces, the growth of the peak on the short wavelength side of the stop band is a primary factor in the failure of the single mode oscillation. In the DFB-LDs which have the magnitudes of the phase shifts of 9Λ/40 and 8Λ/40 shown in FIGS. 4C, 4D and FIGS. 6C, 6D, at the time of the electric current of 30 mA, the main modes stand at the center of the stop band, and the growth of the peak on the stop band short wavelength side is suppressed. Accordingly, it has been confirmed that, if the magnitude of the phase shift is made greater than 10Λ/40 in the setting of the electron beam patterning, the single mode oscillation is most likely to fail when the electric current of the operation level is injected, and that, if the magnitude of the phase shift is set at 8Λ/40 to 9Λ/40, the stable single mode oscillation is achievable when the electric current of the operation level is injected.

Figure 7:
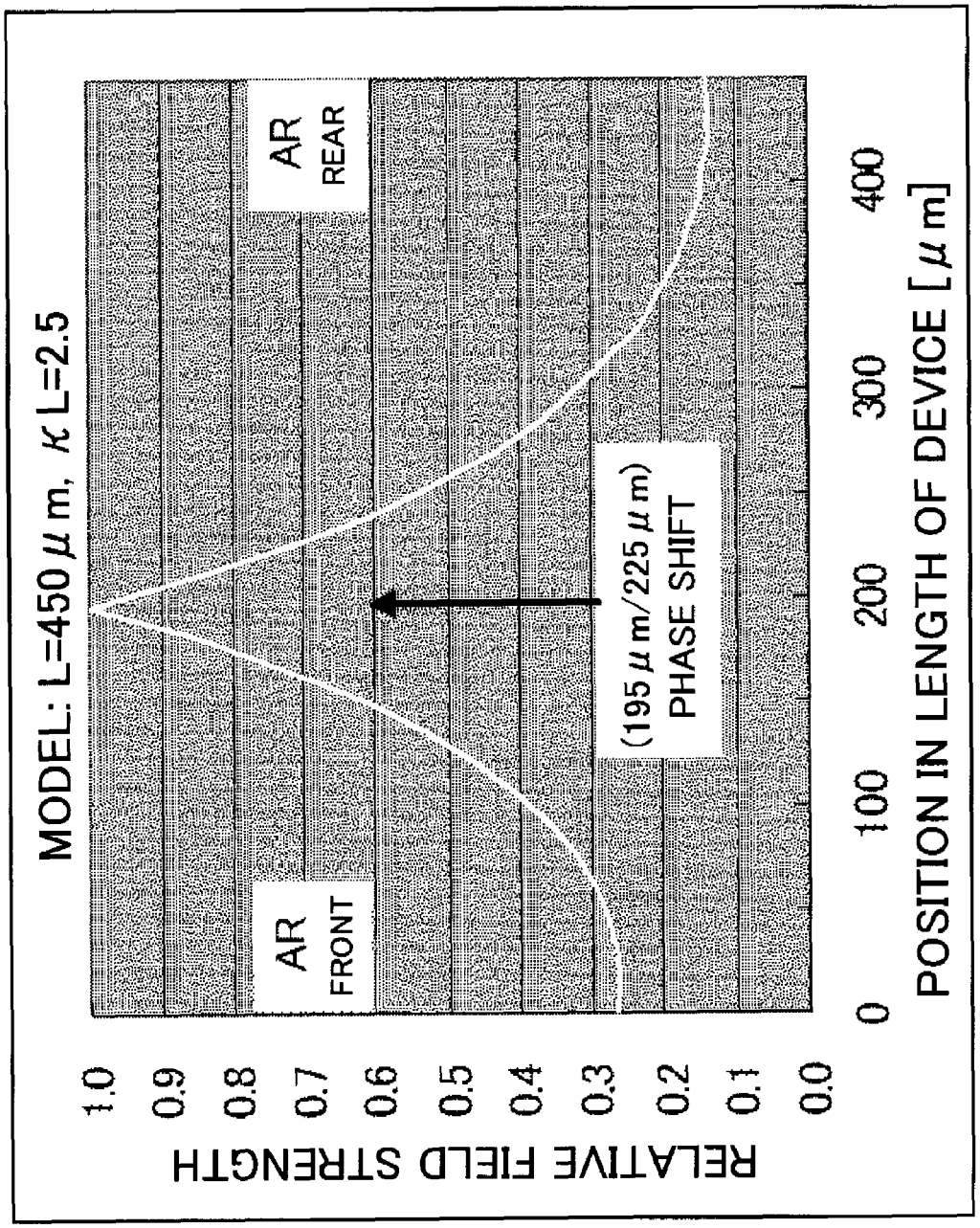
FIG. 7 is an optical field distribution of a DFB-LD oscillation in example 1.

An optical field distribution at the time of oscillation of the DFB-LD having κL of 2.5, made in example 1, is shown in FIG. 7. The optical field distribution at the time of the oscillation has a peak (maximum) at the position of the phase-shifter. Stimulated emission increases carrier consumption in the strong optical field. This decrease carrier density of the phase-shifting portion as compared to other parts relatively, and increases a refractive index of the waveguide. The higher an optical output is, that is, the greater the operating electric current is, the more remarkable is this phenomenon. Therefore, with the increase of the injected electric current, the length of the optical path in the phase-shifting portion increases. It is concluded that the single mode oscillation can be achieved by taking account of the increase of the length of the optical path and preliminarily making the magnitude of the phase shift slightly smaller than Λ/4 at the time of a formation of the diffraction gratings, preferably, 8Λ/40 to 9Λ/40.

Example 2

Figure 8B:
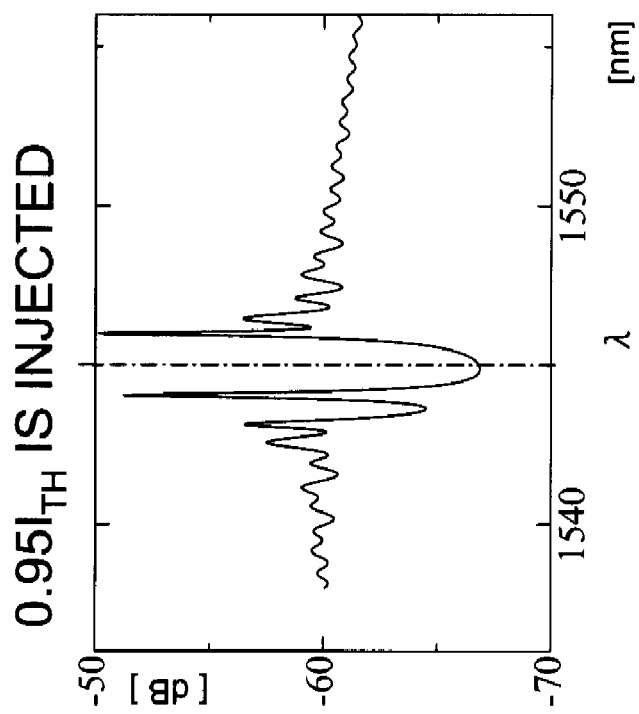
FIGS. 8A and 8B show simulation results in example 2.
Figure 8A:
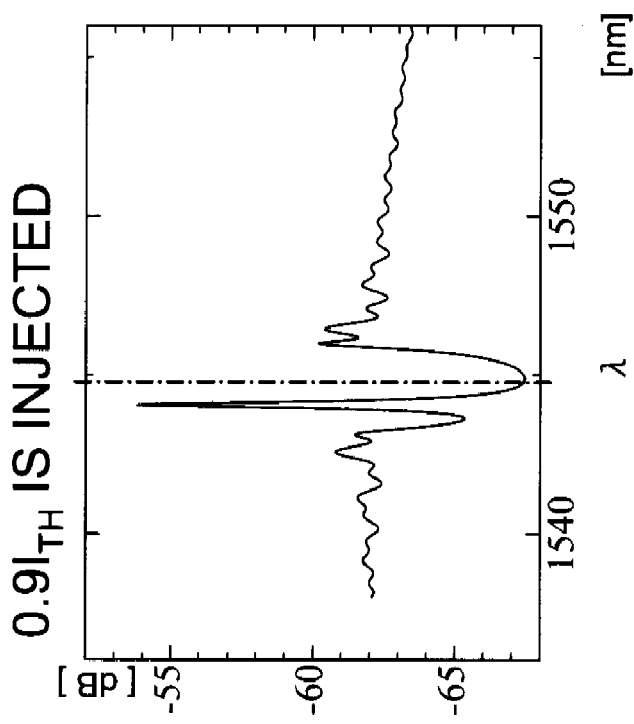
Figure 9B:
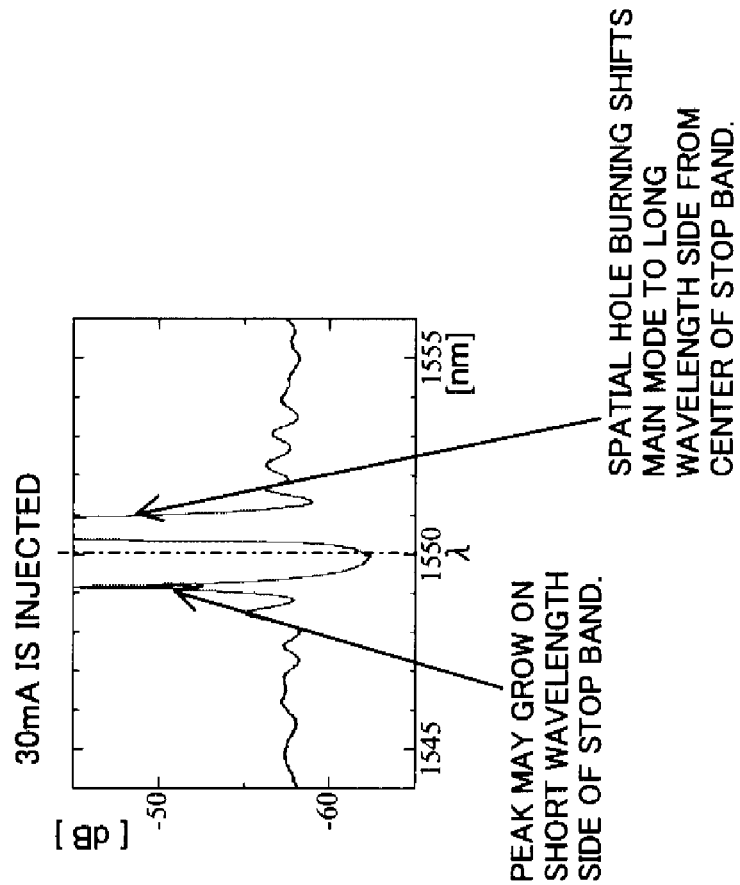
FIGS. 9A and 9B show spectra in a DFB-LD having the magnitude of a phase shift of Λ/4.
Figure 9A:
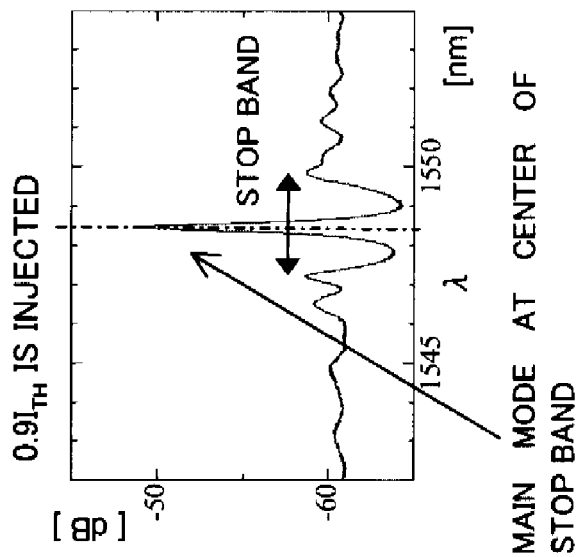

The spectra of the DFB-LDs having the magnitude of the phase shift of 8Λ/40 to 11Λ/40 were observed in example 1, whereas, in example 2, spectra of the DFB-LD having the magnitude of the phase shift less than 8Λ/40 were simulated. The spectra of the DFB-LD in the same way as example 1, having the coupling constant κL of 3.5 and the magnitude of the phase shift of 6Λ/40, were simulated. The simulation results are shown in FIGS. 8A and 8B. When the injected current is at 0.9 $I_{th}$ (FIG. 8A), the main mode stands on the shorter wavelength side than the center of the stop band. When the injected current is at 0.95 $I_{th}$ (FIG. 8B), the difference between the main mode and the sub mode decreases since a peak on the long wavelength side grows. This state does not result in the single mode oscillation, but in a two-mode oscillation. Accordingly, it has been confirmed that the single mode oscillation is difficult to be achieved when the magnitude of the phase shift is made further less than 8Λ/40.

It is understood that the DFB-LD of the present invention is not limited to the above modes and examples and may further include various modifications, alternations and improvements within the scope of the present invention. The DFB-LD of the present invention is available without depending on an element such as the length of a device, a wavelength band, a coupling constant κL, and a structure of the DFB-LD (a structure of an active layer, clad layer, optical guide layer, cap layer, electrode, and so on). The DFB-LD of the present invention is applicable to a structure which has diffraction gratings above an active layer, too.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A distributed feedback laser diode comprising a phase-shifting portion within diffraction gratings,
    wherein the magnitude of a phase shift caused by the phase-shifting portion is 8Λ/40 to 9Λ/40, Λ representing twice the pitch of the diffraction gratings, and
    wherein the magnitude of the phase shift equals the width of the phase-shifting portion along the direction of oscillation of the diffraction gratings,
    wherein the distributed feedback laser diode has a coupling coefficient between 2.5 and 3.5, and
    wherein a main mode stands on a shorter wavelength side of a center of a stop band when injected current is at a level of a threshold current, and the main mode is shifted to the center of the stop band and the submode is suppressed from growing when injected current is at a level of an operating current, such that the distributed feedback laser diode achieves single mode operation when injected with an electric current that is higher than an electric current for normal operation.

2. The distributed feedback laser diode according to claim 1, further comprising anti-reflecting films on both end faces.

* * * * *